United States Patent
Saviotti

(10) Patent No.: US 11,263,125 B2
(45) Date of Patent: Mar. 1, 2022

(54) MANAGING MEMORY SECTOR SWAPPING USING WRITE TRANSACTION COUNTS

(71) Applicant: STMicroelectronics S.r.l., Agrate Brianza (IT)

(72) Inventor: Alberto Saviotti, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 62 days.

(21) Appl. No.: 16/570,446

(22) Filed: Sep. 13, 2019

(65) Prior Publication Data

US 2020/0097398 A1     Mar. 26, 2020

(30) Foreign Application Priority Data

Sep. 20, 2018    (IT) .................. 102018000008750

(51) Int. Cl.
    *G06F 12/02*      (2006.01)
    *G06F 11/07*      (2006.01)
    (Continued)

(52) U.S. Cl.
    CPC ........ *G06F 12/0246* (2013.01); *G06F 11/076* (2013.01); *G06F 11/2056* (2013.01);
    (Continued)

(58) Field of Classification Search
    CPC ............... G06F 12/0246; G06F 11/076; G06F 11/2056; G06F 12/0292; G06F 12/0868;
    (Continued)

(56) References Cited

U.S. PATENT DOCUMENTS

| | | |
|---|---|---|
| 5,386,533 A | 1/1995 | Morris |
| 6,965,526 B2 | 11/2005 | Cavaleri et al. |
| | (Continued) | |

FOREIGN PATENT DOCUMENTS

| | | |
|---|---|---|
| CN | 104850500 A | 8/2015 |
| EP | 1559016 | 8/2005 |

OTHER PUBLICATIONS

Hu, Xiao-Yu, et al. "Write amplification analysis in flash-based solid state drives." Proceedings of SYSTOR 2009: The Israeli Experimental Systems Conference. ACM, 2009. (Year: 2009).*

(Continued)

*Primary Examiner* — Charles Rones
*Assistant Examiner* — Hewy H Li
(74) *Attorney, Agent, or Firm* — Slater Matsil, LLP

(57) ABSTRACT

A method can be used for managing a memory circuit that includes memory sectors having respective positions in the memory circuit as well as respective addresses for data transfer transactions. The method includes maintaining a record of coupling pairs of the positions and the addresses. Each coupling pair includes a memory sector in the plurality of memory sectors and an address coupled with the memory sector for data transfer transactions with respect to the memory sector. The method also includes keeping counts of the data transfer transactions involving the memory sectors in the plurality of memory sectors and replacing a first memory sector included in a coupling pair and having a first count of transactions with a second memory sector having a second count of transactions as a result of a condition being met.

23 Claims, 2 Drawing Sheets

(51) Int. Cl.
*G06F 11/20* (2006.01)
*G06F 12/0868* (2016.01)
*G11C 11/409* (2006.01)

(52) U.S. Cl.
CPC ...... *G06F 12/0292* (2013.01); *G06F 12/0868* (2013.01); *G11C 11/409* (2013.01); *G06F 2212/7211* (2013.01)

(58) Field of Classification Search
CPC ........... G06F 2212/7211; G06F 3/0679; G06F 3/0616; G06F 3/064; G06F 2212/1036; G11C 11/409
See application file for complete search history.

(56) References Cited

U.S. PATENT DOCUMENTS

| | | | | |
|---|---|---|---|---|
| 8,745,319 | B2* | 6/2014 | Langlois | G06F 12/0246 |
| | | | | 711/103 |
| 10,031,698 | B2 | 7/2018 | Lin | |
| 2008/0276036 | A1* | 11/2008 | Van Acht | G06F 12/0246 |
| | | | | 711/103 |
| 2008/0282024 | A1* | 11/2008 | Biswas | G06F 12/0246 |
| | | | | 711/103 |
| 2010/0131699 | A1* | 5/2010 | Luukkainen | G06F 12/0246 |
| | | | | 711/103 |
| 2010/0211737 | A1* | 8/2010 | Flynn | G06F 12/0246 |
| | | | | 711/114 |
| 2010/0246266 | A1* | 9/2010 | Park | G11C 16/3495 |
| | | | | 365/185.11 |
| 2011/0238890 | A1 | 9/2011 | Sukegawa | |
| 2011/0246705 | A1* | 10/2011 | Mudama | G11C 16/3495 |
| | | | | 711/103 |
| 2014/0189284 | A1 | 7/2014 | Hyuseinova et al. | |
| 2015/0095546 | A1* | 4/2015 | Bennett | G06F 12/0246 |
| | | | | 711/5 |
| 2015/0347038 | A1* | 12/2015 | Monteleone | G06F 3/0679 |
| | | | | 711/103 |
| 2016/0239383 | A1 | 8/2016 | Feng et al. | |
| 2018/0039435 | A1 | 2/2018 | Lin | |
| 2019/0303283 | A1* | 10/2019 | McGlaughlin | G11C 16/349 |

OTHER PUBLICATIONS

Murugan, Muthukumar, and David HC Du. "Rejuvenator: A static wear leveling algorithm for NAND flash memory with minimized overhead." 2011 IEEE 27th Symposium on Mass Storage Systems and Technologies (MSST). IEEE, 2011. (Year: 2011).*

Panigrahi, Sanjat Kumar, et al., "A simple wear leveling algorithm for NOR type solid storage device", CSIT (Mar. 2014) 2(1), published online Jul. 29, 2014, pp. 65-76.

European Patent Office, Communicaiton pursuant to Article 94(3) EPC, EP Application No. 19196892.4, dated Jul. 13, 2021, 10 pages.

* cited by examiner

MANAGING MEMORY SECTOR SWAPPING USING WRITE TRANSACTION COUNTS

CROSS-REFERENCE TO RELATED APPLICATIONS

This application claims priority to Italian Patent Application No. 102018000008750, filed on Sep. 20, 2018, which application is hereby incorporated herein by reference.

TECHNICAL FIELD

The description relates to memory management.

BACKGROUND

Wear leveling is a factor which deserves attention in those applications that involve memory circuits ("memories").

Memories such as Flash memories may be subject to physical degradation that can lead to device failure. Memory cells can degrade over time with possible failure in memory operations such as read, program and erase, such failures exposing an application to critical errors.

These events may be critical in automotive applications where the lifetime of devices is a relevant factor and no application failure is a target to be pursued.

SUMMARY

Despite the extensive activity in the area, further improved solutions are desirable. One or more embodiments can contribute in providing such an improved solution.

One or more embodiments may relate to a corresponding circuit (memory). One or more embodiments may relate to a corresponding device. A radio receiver, for instance, in a car audio system may be exemplary of such a device.

One example embodiment provides a method of managing a memory circuit comprising a plurality of memory sectors having respective positions in the memory circuit as well as respective addresses (POA) for data transfer transactions with respect to the memory circuit. The method comprises maintaining a record (WL) of coupling pairs of the positions and the addresses wherein each coupling pair includes a memory sector in the plurality of memory sectors and an address coupled with the memory sector for data transfer transactions with respect to the memory sector and keeping counts of the data transfer transactions involving the memory sectors in the plurality of memory sectors. The method also comprises replacing a first memory sector included in a coupling pair and having a first count of transactions with a second memory sector having a second count of transactions as a result of at least one of the first count of transactions of the first memory sector reaching an upper threshold value, or the difference between the first count of transactions for the first memory sector and the second count of transactions for the second memory sector reaching a respective threshold value.

One or more embodiments may comprise a computer program product loadable in the memory of a processing circuit and comprising software code portions for executing the steps of the method when the product is run on the processing circuit. As used herein, reference to such a computer program product is understood as being equivalent to reference to a computer-readable medium containing instructions for controlling the processing system in order to co-ordinate implementation of the method according to one or more embodiments. One or more embodiments can be implemented in modular and/or distributed form.

One or more embodiments may provide a reliable solution for (memory) wear leveling suited for use in various applications.

One or more embodiments may provide "lightweight" solutions both in terms of Million Instructions Per Second (MIPS) and as regards Random Access Memory (RAM) usage.

One or more embodiments may provide solutions suited to be entirely performed in software form.

One or more embodiments may provide solutions that are resilient in respect of data corruption in case of loss of power during wear leveling operations.

One or more embodiments provide solutions that facilitate a prolonged life of applications in compliance with desirable "automotive" lifetime performance.

Adoption of one or more embodiments can be revealed by dumping a memory (for instance, flash memory) content and checking the memory layout and the associated data organization.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
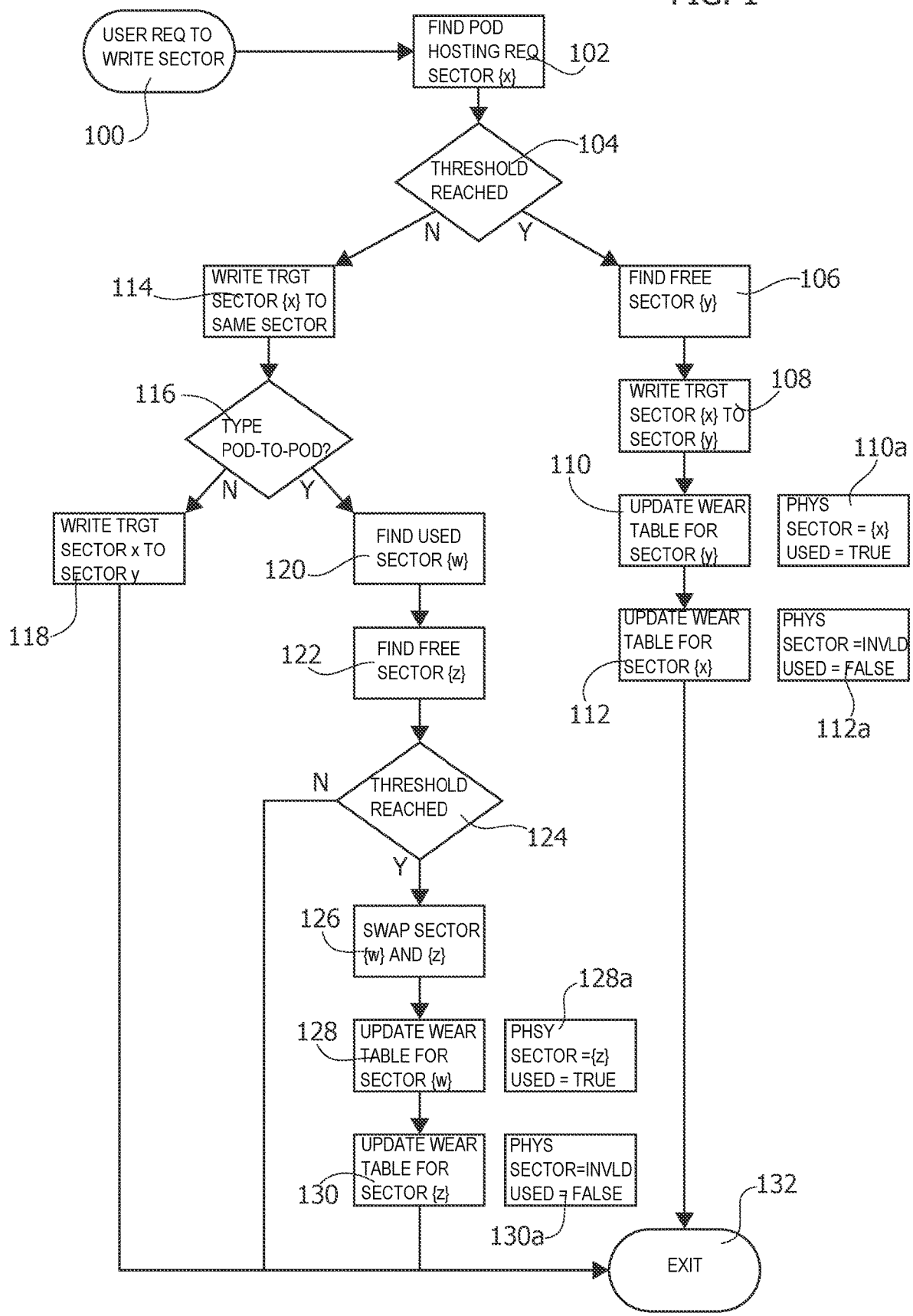
FIG. 1 is a flow chart exemplary of possible acts in embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Memory circuits (briefly, "memories"), such as, for instance, Flash memories are widely used for retaining application data. They may play an important role, for instance, in embedded applications.

Flash memories (NAND and NOR types) can be used as storage medium to contain both application and user data. Both types of memories can be provided as cell arrays, with each cell saving unitary information.

Flash memories may be subject to physical degradation that can lead to device failure. Over time, cells can undergo degradation which may lead to failure in memory operations such as read, program and erase. Any such failure may result in errors in an application. Such events may turn out to be critical in applications such as automotive applications where a guaranteed device lifetime and the absence of application failure are desirable goals to pursue.

These issues have been already extensively addressed, with an intrinsic difficulty in achieving an acceptable balance between complexity and the limitations which may be associated to simple solutions.

For instance, S. K. Panigrahi, et al.: "A simple wear leveling algorithm for NOR type solid storage device", CSIT (March 2014) 2(1), pp. 65-76 disclose a solution which relies on fixed amounts of data written in a simple round robin fashion and which may not be suited for various types of applications.

The possibility may be considered in connection with a Non-Volatile Memory (NVM) of maintaining data in a Random Access Memory (RAM) until the device is powered-off. This solution presents various advantages: for instance, it may be fast because writes can be (always) performed in the RAM, thus limiting the number of writes in the NVM, and may be easy to implement. It is noted that such an approach has a major drawback: it inevitably involves much RAM space used as a buffer, and is thus hardly acceptable for applications expected to use only internal RAM memory space (no external SDRAM or DDR used).

One or more embodiments facilitate managing a memory circuit 10 (see FIG. 2, for instance) capable of storing firmware and application data. Non-Volatile Memories (NVM's) such as Flash memories of the NOR or NAND type are exemplary of memories to which embodiments may apply.

One or more embodiments facilitate an application in accessing an application data section in a memory circuit randomly and with different data sizes.

One or more embodiments are applicable both to external stand-alone memories and to embedded non-volatile memories.

One or more embodiments facilitate reducing internal RAM usage, in those applications where RAM space may represent a precious resource. This may be an issue in applications such as, for instance, real-time automotive embedded systems, where data integrity is another factor to consider so that reducing the possibility of data corruption due to loss of power during operations is a goal to pursue.

One or more embodiments may involve a wear leveling strategy wherein a direct relationship no longer exists between a logical block addressed by an application and the "physical" memory sector where this block is written. No direct match thus exists between the address used by the application and the physical address.

Figure 2:
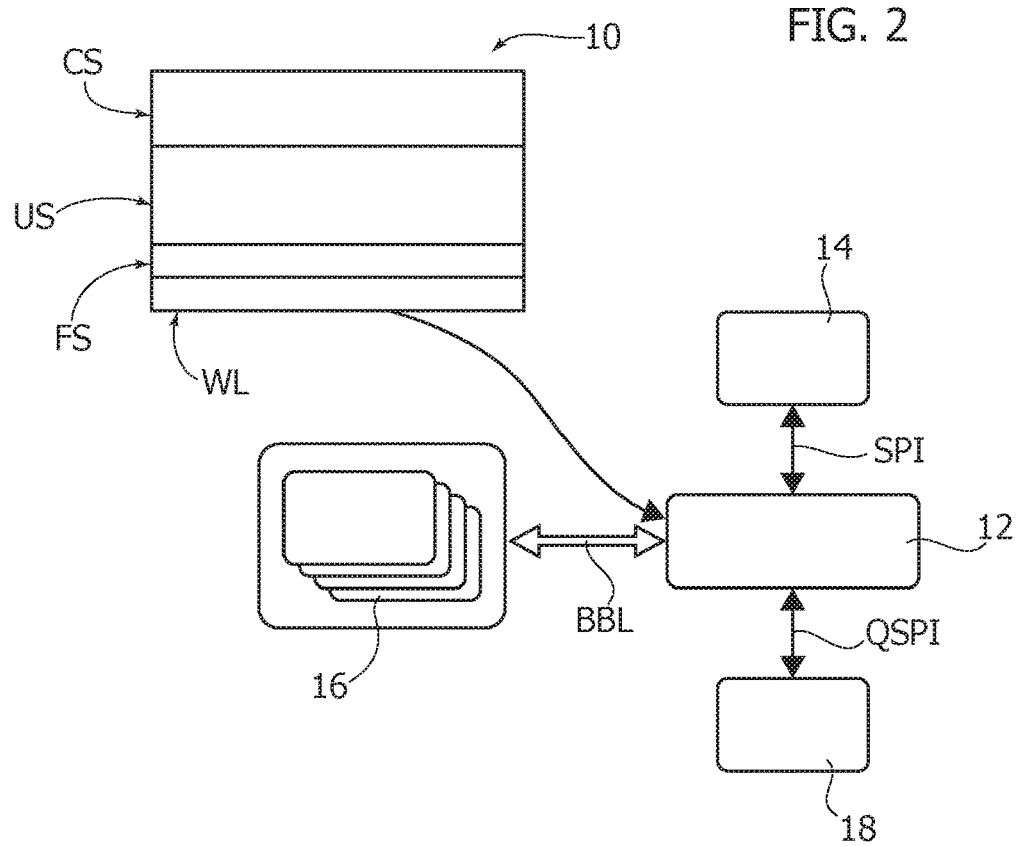
FIG. 2 is a block diagram exemplary of a possible implementation of embodiments.

As exemplified in FIG. 2, one or more embodiments may be applied to a memory circuit 10 (a NVM such as a Flash memory of any known type can be considered as an example) comprising a number n of memory sectors which may be regarded as partitioned in a number of sections such as, for instance:

a code section CS,
a user section US,
a free section FS, and
a wear leveling section WL.

Such partitioning is merely exemplary and is not to be construed, even indirectly, in a limiting sense of the embodiments.

For the sake of simplicity and ease of explanation, the following terminology can be used in order to define data blocks addresses:

PAE denotes the Physical Address at Epoch, that is the physical sector address on the non volatile memory. This address is the one used by the application to read and write data from/to the media (the memory circuit 10);

POD denotes the Physical On Device (i.e. the non-volatile memory) sector. This is the current "physical" position of a sector on the device.

One or more embodiments provide a wear leveling procedure which takes a PAE as an input and converts it into a current POD to be accessed to read or write data as desired.

The procedure maintains a correlation between the physical sector addressed by the application and its position on the device via one or more wear leveling tables. These tables contain the information which facilitates the procedure in tracking sector positions and obtaining usage statistics (for instance, counts of transactions such as writes involving a certain sector).

These tables can be stored in a reserved area of the non-volatile memory 10 such as WL, with a respective leveling technique applied (also) to this area. As discussed in the following, the wear leveling procedure used for these tables may be different from the one applied to the user data.

For instance, the data recorded in the wear leveling tables may include, for each physical sector:

the sector currently present on a specific physical sector;
the number of data transfer transaction (for instance, writes) having been performed for that physical sector;
the number of times that sector has been "swapped" (as discussed in the following);
used flag: set if the physical sector is currently used;
"bad" flag: set if the physical sector becomes bad (i.e. not readable or writable).

A so called "magic number" (essentially a table header) may be provided as a signature used to identify a valid table starting point.

One or more embodiments may contemplate leveling of the user data, that is the section of the memory circuit (Flash memory, for instance) that contains data stored by the application for which protection is desired in order to facilitate a longer life of the device.

For instance, that section may contain quality parameters read during device operation or, in the exemplary case of a radio receiver, the database of available stations (i.e. station name, frequency, ancillary data). These data are written during normal operation of the device and, if updated (too) often, the useful life of the non-volatile memory can be reduced.

One or more embodiments as exemplified herein may facilitate a longer duration of the device thanks to a reduced number of writes on each sector. One or more embodiments may be less prone to loss of data due to retention problems in sectors that are written only seldom.

In one or more embodiments, as seen from a user application standpoint, the memory circuit can be accessed without any modification, with a wear leveling procedure active intermediate the application and the non-volatile memory.

One or more embodiments may involve an acceptable reduction in the usable space due to the presence of free sectors FS and wear leveling table sectors WL. A higher number of writes and erases may result in a longer time involved in performing a write act. This can be taken into account at the application level, by also noting that the write acts may not have a same duration in time (for instance, according to whether wear leveling is being applied or not) from the viewpoint of the application.

As noted, in one or more embodiments, a part of the non-volatile memory circuit 10 may be used for internal purposes and thus be unavailable to the application; this may result in a moderate reduction of the space available to the application.

One or more embodiments may operate on memory sectors defined as a function of the memory geometry (for instance, 4 Kbyte sectors can be used in one or more embodiments). Sector size may be considered by the wear leveling tables as the unitary size to store information about sector position and usage statistics.

It will be otherwise appreciated that a wear leveling procedure according to embodiments can operate with arbitrary sector dimensions. It is otherwise noted that relying on the (non-volatile) memory geometry may improve read/write speed performance. Also, smaller blocks may result in wear leveling tables becoming larger. Conversely, larger blocks may result in memory space being wasted in case few bytes are written in each block. These factors suggest selecting the non-volatile sector dimension as base block.

A possible implementation of embodiments is exemplified in the flow chart of FIG. 1.

The blocks in the flow chart of FIG. 1 identify the following acts (to be further discussed in the sequel of this description):

- 100: a user requests to write a sector in the memory circuit 10
- 102: find current POD hosting the requested sector, {x}
- 104: is POD-to-POD threshold reached?
- 106: with threshold at 104 reached, find a free sector {y} with lowest number of writes
- 108: write user target sector "x" to sector "y" found
- 110: update the wear leveling table for sector "y" (written sector)
- 110*a*: physical sector="x" Used=true
- 112: update the wear leveling table for sector "x" (swapped sector) and go to exit (block 132)
- 112*a*: physical sector=invalid Used=false
- 114: as a result of threshold at 104 not reached, write user target sector "x" in the same sector currently holding it (no swap)
- 116: check if last swap procedure applied was of type POD-to-POD (see below); this is beneficial in reducing the number of times the PAE-to-POD (see below) swap procedure is applied
- 118: with outcome of 116 negative, write user target sector "x" to sector "y" found and go to exit (block 132)
- 120: with outcome of 116 positive, find used sector with PAE written lowest number of times ("w")
- 122: find free sector with highest write count ("z")
- 124: is PAE-to-POD threshold reached? If outcome negative go to exit (block 132)
- 126: if outcome of 124 positive, move (swap) the two sectors identified at 120 and 122
- 128: update the wear leveling table for sector "w"
- 128*a*: physical sector="z" Used=true
- 130: update the wear leveling table for sector "z" and go to exit (block 132)
- 130*a*: physical sector=invalid Used=false
- 132: exit.

A procedure as exemplified in the flow chart of FIG. 1 is triggered on data write (for instance, following a request from a user as exemplified at 100 in FIG. 1) and performs wear leveling using essentially two types of sector replacement or "swap":

- POD-to-POD swap,
- PAE-to-POD swap.

These two approaches together facilitate an evenly distributed number of transactions (writes) between sectors without copying used sectors to other used sectors, thus facilitating valid data distribution with a minimum risk of data loss.

In one or more embodiments, that result can be reached moving used sectors (always) to free ones and declaring the previously used sector as free in the wear leveling table but without actually erasing it. If something like an unexpected event occurs between the update of the sector and the corresponding update of the wear leveling table(s) the "old" data is still available as it is pointed by a valid wear leveling table present on the device.

One or more embodiments thus facilitate "trimming" the procedure by changing functional parameters in order to facilitate obtaining a particular behavior depending on application requirements.

In one or more embodiments, configurable parameters may comprise:

- thresholds (in general);
- threshold for POD-to-POD copy: this is indicative of the difference of writes between two physical sectors;
- threshold for PAE-to-POD copy: this is indicative of the difference between a logical sector (accesses from application) and a physical sectors number of writes;
- number of changes in the wear leveling table before this is updated to device; this parameter controls when the wear leveling table is updated on the media; using a value greater than one result in data loss possibility in case of shut down operations not correctly performed. For instance, the used value may be fixed to one;
- number of copies of the wear leveling table;
- number of free sectors.

One or more embodiments may include:

- the possibility of defining an addressable size used to manage all I/O operations;
- the use of free sectors as target of move (swap) operations in order to reduce possibility of losing data leaving the memory in incoherent status;
- redundancy applied on wear leveling tables for robustness;
- a customizable behavior by acting on parameters in order to set a desired level of space devoted to the procedure, thus avoiding reducing too much the memory space available to the application while also achieving robustness;
- a simple mechanism to define sectors suitable for movement.

A few million instructions per second (MIPS) may be involved in performing the wear levelling procedure of one or more embodiments. Also, the procedure can be applied to write transactions without any specific background task running to apply it, which makes it suitable for use in applications without an operating system.

As noted, one or more embodiments may involve a POD-to-POD replacement (swapping) of a first sector by a second memory sector as a result of the count of transactions (for instance, write acts) for the first memory sector reaching an upper threshold value (see block 104 in FIG. 1).

This first wear leveling approach (POD-to-POD swapping) can be triggered on an actual transaction (write, for instance) of the memory circuit 10 from the application. When data is written the procedure will check if the number of, for instance, writes on this particular sector has reached the threshold. For instance, a sector can be regarded as written each time a single byte is changed because the memory 10 requires the sector to be erased first and then written with the new data.

In that case, the number of writes maintained in the wear leveling table can be read for the sector ("x") addressed by the application (that is the sector that the application would like to update).

If a (possibly adjustable) upper threshold for the number of writes is reached (positive outcome of block 104 in FIG. 1), then sector swap is activated.

In one or more embodiments, the swap operation can be executed by reading both sectors in an internal RAM memory space and then writing them by exchanging the roles of the two sectors: the free sector with lowest number of writes on it is searched (block 106 in FIG. 1) and the two sectors swapped by using the sequence exemplified by blocks 108 to 112 in FIG. 1, namely by searching a free sector with a lowest number writes on it ("y" in block 108) and writing the original target sector ("x") over the newly found free sector ("y").

The wear leveling table is updated (blocks 110, 112) and written in the associated section (WL in FIG. 2), possibly once certain specific conditions have been reached as discussed in the following.

For instance, the previous wear leveling table is erased once the new one has been written (for instance, in a neighboring area) in the circuit 10.

During this sequence, in case of a failure between commands, the data will be recoverable at previous status. If a failure occurs after the sector is written and before the wear leveling table is written, than the old data is still recoverable. A failure during a write of a sector will result in a second attempt to a new sector, while the faulty one is marked as "bad" in the wear leveling table.

An operation cycle as discussed involves two write acts (the data sector and the wear leveling table) and two erase acts (the data sector and the previously used wear leveling table).

In one or more embodiments, such a wear leveling procedure can be activated only once per application write.

As noted, one or more embodiments may involve a PAE-to-POD replacement (swapping) of a first sector by a second memory sector as a result of the difference between the first count of transactions for the first memory sector and the second count of transactions for the second memory sector reaches a respective threshold value.

This second wear leveling approach (PAE-to-POD swapping) is based on the assumption that having sectors evenly worn may be facilitated by "cold" sectors becoming free sectors available for swapping.

The designation "cold" sectors may be applied to those sectors in a memory circuit such as 10 that are rarely accessed by the application and usually left unchanged for a long time.

Such a wear leveling approach can be applied on application transactions such as write transactions once it is determined that no POD-to-POD swapping is being activated, that is when it is determined that a write transaction on a sector did not cause the swap threshold to be reached (for instance, as a result of the check in block 104 of FIG. 1 yielding a negative outcome).

In one or more embodiments such a PAE-to-POD swapping procedure may involve searching a "cold" used sector with a lowest (minimum) number of writes is searched—see block 120 of FIG. 1—as well as a free sector with a highest (maximum) number of writes—see block 122 in FIG. 1.

The difference between the transaction (for instance, write) counts of the two sectors thus found is calculated and, if this difference reaches a certain (possibly adjustable) upper threshold (see block 124 in FIG. 1), sector swap is activated.

Sector swap may occur along the same lines of the POD-to-POD swapping sequence discussed previously.

That is, the "cold" sector is read and (over)written on the newly found free sector (see block 126 in FIG. 1) and the wear leveling table is updated and written in the circuit (see blocks 128 and 130 in FIG. 1).

Operation as described involves one sector read act, two sector write acts and two sector erase acts.

In order to reduce the number of activations of such a PAE-to-POD leveling procedure, which may involve a certain time to be completed (and possibly lead to an undesirably high amount of sector swaps), in one or more embodiments the (difference or "delta") threshold triggering the procedure may be selected to be higher than the threshold used to trigger for POD-to-POD leveling.

As noted, one or more embodiments may provide for the presence of a wear leveling section WL in the (non-volatile) memory 10 reserved to store the wear leveling tables.

This section may adopt a specific approach in order to limit the physical degradation of the sectors used therein. In one or more embodiments, such an approach may rely on the recognition that the amount of data to be written each time is well known and fixed, insofar as it depends (only) on table size, which in turn is related to the number of sectors used for data storage and the free sectors.

In one or more embodiments, the target of avoiding transactions (for instance, writes) always occurring on a same sector in the section WL may be achieved by writing a new table on the "next" space allocated for tables in a round-robin fashion, that is with a wear leveling act which erases the "previous" version of the table as a result of writing the "updated" version being successful.

This round-robin mechanism facilitates the procedure in finding a wear leveling table to be discovered automatically at startup, searching for a valid table.

In one or more embodiments, a valid table may be defined as the one having a correct "magic" number stored in the table header section, that is a (per se arbitrary) signature for use in identifying the goodness of the sector. It will be appreciated that erased copies may not present the signature because all data is set at FF value.

For instance, in one or more embodiments, the updated table can be written in the "next" entry in the section WL, incrementing current base sector by the size of the table. The current base sector for the wear leveling tables is increased by the number of sector each table occupies so that the new base sector may start storing the data. If the end of the section is reached, the base pointer is set to the first sector belonging to the wear leveling section. If the write act is successful, then the previous version of the table can be erased (for instance, all sectors belonging to it are erased).

Writing leveling tables using a round-robin mode was found to offer the advantage of simplicity of management that is well adapted with the kind of data handled, with fixed length blocks updated fairly often.

The lower portion of FIG. 2 is exemplary of the possibility of implementing the procedures as discussed previously via software code run on a processing circuit such as the (main) microprocessor in an automotive digital radio processor 12 intended to cooperate via a control link (for instance, SPI) with a host processor 14 in a system comprising, for instance, a tuner module 16 coupled to the microprocessor 12 via a baseband link BBL. An external serial NOR flash memory 18 may be provided coupled to the microprocessor 12 via a QUAD Serial Peripheral Interface (QSPI). The product MSR1=(ST) Multichannel Software defined Radio (first generation), available with ST, may be exemplary of such a device to which embodiments may be contemplated to be applied.

As noted, one or more embodiments are applicable both to external stand-alone memories and to embedded non-volatile memories.

Of course, referring to such a possible context of use is merely exemplary and not limiting of possible embodiments.

Figure 3:
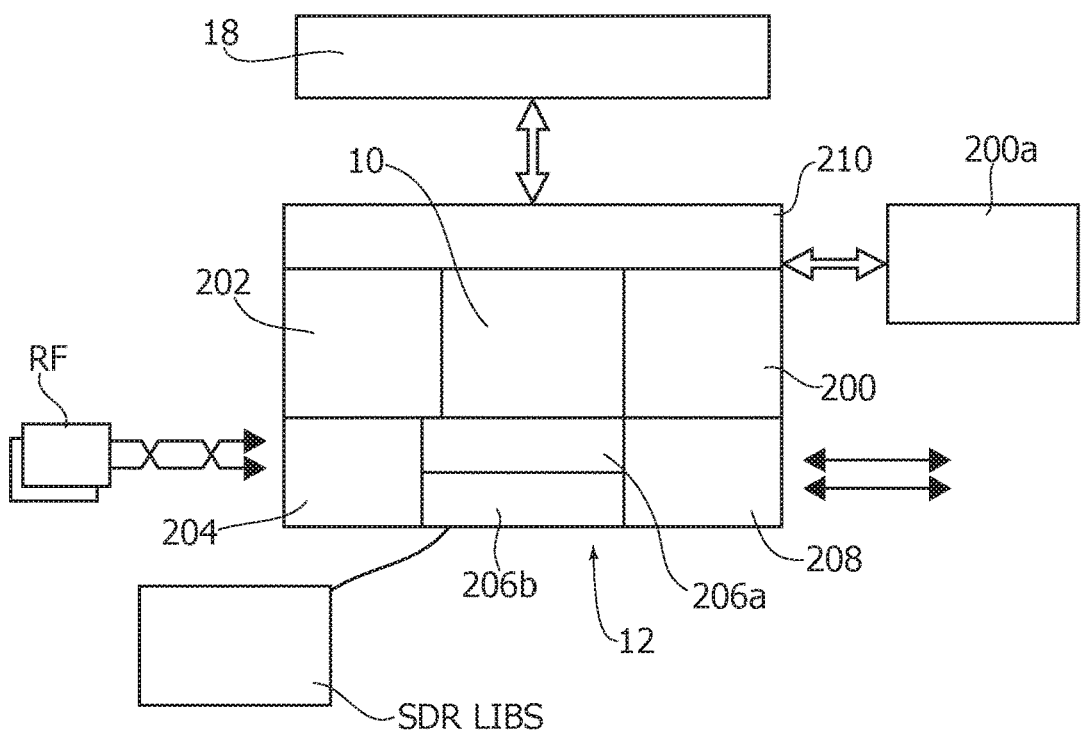
FIG. 3 is a block diagram of an exemplary device suited to incorporate embodiments.

As further detailed—again merely by way of example—in FIG. 3, the device 12 may comprise, in addition to the memory circuit 10 (for instance, as an embedded memory) a control/application core circuit (for instance, a microcontroller Unit—MCU) 200 configured to run software code implementing the wear leveling procedures discussed in the foregoing.

As exemplified in FIG. 3 the device 12 may comprise an audio subsystem 202, a tuner subsystem (I/F) 204 configured to cooperate with a radio-frequency stage RF, radio processor units (digital 206*a*, analog 2*o*6*b*) configured to cooperate with one or more software defined radio libraries (SDR LIBs), developed in a manner known to those of skill in the art, various system input/output (I/O) peripherals 208, and an external memory control 210 interfacing with the external memory 18.

Again it is noted that one or more embodiments are applicable both to external stand-alone memories and to embedded non-volatile memories.

In one or more embodiments the circuit 200 may be configured to run an associated software platform 200*a* including (in a manner known to those of skill in the art) tuner middleware and a system input/output (I/O) software developer's kit (SDK).

Again, the system layout described in the foregoing is merely exemplary and shall not be construed, even indirectly, in a limiting sense of embodiments.

In addition to facilitating memory management one or more embodiments may exhibit advantages related to various factors such as, for instance, the possibility of dispensing with additional information in support the swapping process of memory sectors.

While exemplified herein with emphasis placed on non-volatile memories such as Flash memories, one or more embodiments may be adopted in connection with various types of embedded applications using real-time kernels.

One or more embodiments facilitate reducing RAM memory usage, while extending the useful life of memory circuits and devices using them, by keeping the amount of data on the circuit/device at a consistent amount and avoiding MIPS consuming approaches. Faulty-safe, redundant wear-levelling of data is facilitated by the embodiments Usage of one or more embodiments can be possibly detected by checking the signature on an external flash device (that is, by dumping the flash content) and the data distribution in sectors used for wear leveling.

One or more embodiments may relate to a method of managing a memory circuit (for instance, 10) comprising a plurality of memory sectors having respective positions (for instance, POD) in the memory circuit as well as respective addresses (for instance, POA) for data transfer transactions with respect to the memory circuit, the method comprising:

maintaining a record (for instance, in WL in 10) of coupling pairs of the positions and the addresses wherein each coupling pair includes a memory sector in the plurality of memory sectors and an address coupled with the memory sector for data transfer transactions with respect to the memory sector, keeping counts of the data transfer transactions involving the memory sectors in the plurality of memory sectors, the method comprising replacing (for instance, 108 or 126) a first memory sector included in a coupling pair and having a first count of transactions with a second memory sector having a second count of transactions as a result of at least one of:

a) the first count of transactions of the first memory sector reaching an upper threshold value (for instance, 104), or (for instance, as a result of checking that a) is not being applied)

b) the difference between the first count of transactions for the first memory sector and the second count of transactions for the second memory sector reaching a respective threshold value (for instance, 124).

One or more embodiments may comprise selecting (for instance, 106) the second memory sector to replace (for instance, 108) a first memory sector having the first count of transactions reaching an upper threshold value as a free memory sector (for instance, as a sector available for writing due to being blank or to having stored therein data which can be erased or overwritten having a lowest count of transactions in the plurality of memory sectors.

One or more embodiments may comprise selecting (for instance, 120, 122) the first memory sector and the second memory sector to replace (for instance, 126) the first sector as a result of the difference between the first count of transactions for the first memory sector and the second count of transactions for the second memory sector reaching a respective threshold value respectively as a used memory sector (for instance, 120) having a lowest count of transactions in the plurality of memory sectors and a free memory sector having a highest count of transactions in the plurality of memory sectors.

In one or more embodiments replacing the second memory sector for the first memory sector may comprise overwriting the contents of the first memory sector over the second memory sector.

One or more embodiments may comprise replacing the second memory sector for the first memory sector as a result of the first memory sector being addressed (for instance, 100) for performing a data transfer transaction involving the first memory sector.

In one or more embodiments the data transfer transactions may comprise write acts of data to the memory sectors.

One or more embodiments may comprise storing the record of coupling pairs as at least one table (for instance, WL in 10) and updating (for instance, 110, 112 or 128, 130) the at least one table to mirror the second memory sector replacing the first memory sector.

In one or more embodiments updating the at least one table (WL) to mirror the second memory sector replacing the first memory sector may comprises declaring the first memory sector replaced by the second memory sector as free in the at least one table while temporarily refraining from erasing the first memory sector.

One or more embodiments may comprise providing in the memory circuit a plurality of memory spaces instance, WL in 10) for storing the at least one table of coupling pairs, and writing an updated table of coupling pairs in a memory space in the plurality of memory spaces in the memory circuit other than the memory space in the plurality of memory spaces in the memory circuit where the table of coupling pairs was written prior to updating, for instance, according to a round-robin arrangement.

A circuit (for instance, 12 in FIGS. 2 and 3) according to one or more embodiments may comprise a memory circuit (for instance, 10) comprising a plurality of memory sectors having respective positions in the memory circuit as well as respective addresses for data transfer transactions with respect to the memory circuit, and a memory management circuit (for instance, 200 in FIG. 3) configured to manage the memory circuit with the method of one or more embodiments.

In one or more embodiments a device (see, for instance, FIG. 3) may comprise a circuit according to one or more embodiments, and at least one data source (see, for instance, 202, 204, 206a, 208, 210 in FIG. 3) coupled with the circuit and configured to produce data for writing in the memory circuit.

In one or more embodiments, such a device may comprises a radio receiver (see, for instance, 204, 206a, 206h).

One or more embodiments may related to a computer program product loadable in a processing circuit (see, for instance, 200 in FIG. 3) and comprising software code portions for implementing the steps of the method of one or more embodiments when the product is run on the processing circuit.

Without prejudice to the underlying principles, the details and embodiments may vary, even significantly, with respect to what has been described by way of example only, without departing from the extent of protection.

The extent of protection is determined by the annexed claims.

What is claimed is:

1. A method of managing a memory circuit that comprises a plurality of physical memory sectors having respective positions in the memory circuit as well as respective addresses for data transfer transactions with respect to the memory circuit, the method comprising:
    maintaining a record of coupling pairs of the positions and the addresses, wherein each coupling pair includes a physical memory sector in the plurality of physical memory sectors and an address coupled with the physical memory sector for data transfer transactions with respect to the physical memory sector;
    keeping counts of the data transfer transactions involving write acts of data to the physical memory sector in the plurality of physical memory sectors;
    replacing, in a first mode of operation, a first memory sector with a second memory sector in the plurality of physical memory sectors, the first memory sector included in a coupling pair and having a first count of write transactions, the second memory sector having a second count of write transactions, the replacing the first memory sector with the second memory sector based on determining that the first count of write transactions reach a first threshold value for a number of write acts of data associated with the first memory sector; and
    replacing, in a second mode of operation, the first memory sector with the second memory sector based on determining that a difference between the first count of write transactions and the second count of write transactions reach a second threshold value, wherein the second threshold value is greater than the first threshold value.

2. The method of claim 1, further comprising selecting, in the first mode of operation, the second memory sector as a free memory sector having a lowest count of write transactions in the plurality of physical memory sectors.

3. The method of claim 1, further comprising selecting, in the second mode of operation, the first memory sector and the second memory sector, respectively, as a used memory sector having a lowest count of write transactions in the plurality of physical memory sectors and a free memory sector having a highest count of write transactions in the plurality of physical memory sectors.

4. The method of claim 1, wherein replacing the second memory sector for the first memory sector comprises overwriting contents of the first memory sector over the second memory sector.

5. The method of claim 1, further comprising replacing the second memory sector for the first memory sector as a result of the first memory sector being addressed for performing a data transfer transaction involving the first memory sector.

6. A non-transitory computer readable media storing computer instructions, that when executed by a processor, cause the processor to perform the steps of claim 1.

7. The method of claim 1, further comprising updating the record after replacing the first memory sector with the second memory sector in each of the first mode of operation and second mode of operation.

8. A method of managing a memory circuit that comprises a plurality of physical memory sectors having respective positions in the memory circuit as well as respective addresses for data transfer transactions with respect to the memory circuit, the method comprising:
    maintaining a record of coupling pairs of the positions and the addresses, wherein each coupling pair includes a memory sector in the plurality of physical memory sectors and an address coupled with the memory sector for data transfer transactions with respect to the memory sector;
    keeping counts of the data transfer transactions involving the memory sector in the plurality of physical memory sectors; and
    replacing, in a first mode of operation, a first memory sector with a second memory sector in the plurality of physical memory sectors, the first memory sector included in a coupling pair and having a first count of write transactions, the second memory sector having a second count of write transactions, the replacing the first memory sector with the second memory sector based on determining that the first count of write transactions reach a first threshold value for a number of writes associated with the memory circuit;
    replacing, in a second mode of operation, the first memory sector with the second memory sector based on determining that a difference between the first count of write transactions and the second count of write transactions reach a second threshold value, wherein the second threshold value is greater than the first threshold value; and
    storing the record of coupling pairs as at least one table and updating the at least one table to mirror the second memory sector replacing the first memory sector.

9. The method of claim 8, wherein updating the at least one table comprises declaring the first memory sector replaced by the second memory sector as free in the at least one table while temporarily refraining from erasing the first memory sector.

10. The method of claim 8, further comprising:
providing in the memory circuit a plurality of memory spaces for storing the at least one table of coupling pairs; and
writing an updated table of coupling pairs in the memory space in the plurality of memory spaces in the memory circuit other than the memory space in the plurality of memory spaces in the memory circuit where the table of coupling pairs was written prior to updating.

11. The method of claim 8, further comprising selecting, in the first mode of operation, as a free memory sector having a lowest count of write transactions in the plurality of physical memory sectors.

12. The method of claim 8, further comprising selecting, in the second mode of operation, the first memory sector and the second memory sector, respectively, as a used memory sector having a lowest count of write transactions in the plurality of physical memory sectors and a free memory sector having a highest count of write transactions in the plurality of physical memory sectors.

13. The method of claim 8, wherein replacing the second memory sector for the first memory sector comprises overwriting contents of the first memory sector over the second memory sector.

14. The method of claim 8, comprising replacing the second memory sector for the first memory sector as a result of the first memory sector being addressed for performing a data transfer transaction involving the first memory sector.

15. A non-transitory computer readable media storing computer instructions, that when executed by a processor, cause the processor to perform the steps of claim 8.

16. A device, comprising:
a memory circuit comprising a plurality of physical memory sectors having respective positions in the memory circuit as well as respective addresses for data transfer transactions with respect to the memory circuit,
a memory management circuit configured to manage the memory circuit by:
maintaining a record of coupling pairs of the positions and the addresses, wherein each coupling pair includes a memory sector in the plurality of physical memory sectors and an address coupled with the memory sector for data transfer transactions with respect to the memory sector;
keeping counts of the data transfer transactions involving each memory sector in the plurality of physical memory sectors;
replacing, in a first mode of operation, a first memory sector with a second memory sector in the plurality of physical memory sectors, the first memory sector included in a coupling pair and having a first count of write transactions, the second memory sector having a second count of write transactions, the replacing the first memory sector with the second memory sector based on determining that the first count of write transactions reach a first threshold value for a number of writes associated with the memory circuit; and
replacing, in a second mode of operation, the first memory sector with the second memory sector based on determining that a difference between the first count of write transactions and the second count of write transactions reach a second threshold value, wherein the second threshold value is greater than the first threshold value.

17. The device according to claim 16, further comprising a data source coupled with the memory circuit and configured to produce data for writing in the memory circuit.

18. The device of claim 17, wherein the device comprises a radio receiver.

19. The device of claim 16, wherein the memory management circuit is further configured to manage the memory circuit by selecting, in the first mode of operation, the second memory sector as a free memory sector having a lowest count of write transactions in the plurality of physical memory sectors.

20. The device of claim 16, wherein the memory management circuit is further configured to manage the memory circuit by selecting, in the second mode of operation, the first memory sector and the second memory sector, respectively, as a used memory sector having a lowest count of write transactions in the plurality of physical memory sectors and a free memory sector having a highest count of write transactions in the plurality of physical memory sectors.

21. The device of claim 16, wherein replacing the second memory sector for the first memory sector comprises overwriting contents of the first memory sector over the second memory sector.

22. The device of claim 16, wherein the memory management circuit is further configured to manage the memory circuit by replacing the second memory sector for the first memory sector as a result of the first memory sector being addressed for performing a data transfer transaction involving the first memory sector.

23. The device of claim 16, wherein the first threshold value is an adjustable value.

* * * * *